June 10, 1969 J. RUPPRECHT ET AL 3,449,173

THERMOELECTRIC COUPLE WITH SOFT SOLDER ELECTRICALLY CONNECTING SEMI-CONDUCTORS AND METHOD OF MAKING SAME

Original Filed Sept. 15, 1965

United States Patent Office 3,449,173
Patented June 10, 1969

3,449,173

THERMOELECTRIC COUPLE WITH SOFT SOLDER ELECTRICALLY CONNECTING SEMI-CONDUCTORS AND METHOD OF MAKING SAME

Joachim Rupprecht, Nuremberg, and Heinz Walz, Erlangen, Germany, assignors to Siemens Aktiengesellschaft, Erlangen, Germany, a corporation of Germany Continuation of application Ser. No. 487,454, Sept. 15, 1965. This application June 3, 1968, Ser. No. 740,773
Claims priority, application Germany, Sept. 18, 1964, S 93,220
Int. Cl. H01v 1/14
U.S. Cl. 136—205 3 Claims

ABSTRACT OF THE DISCLOSURE

A thermoelectric couple including a pair of semiconductor members, a pair of side element portions of electrically conductive plate material in contact engagement respectively with each of the semiconductor members, and a middle element portion of electrically conductive soft solder extending between and in contact engagement with the side element portions for electrically connecting the semiconductor members.

The method of producing the foregoing connector element includes mounting metallic end plates on semiconductor members of opposite conductivity type spaced from one another, placing soft solder material adjacent the end plates, and heating the end plates and the soft solder material to a temperature at which the soft solder material softens and flows into engaging contact with the end plates in the space therebetween.

This is a continuation of my copending application Ser. No. 487,454, filed Sept. 15, 1965 now abandoned, for Metal Connector Elements for Galvanically Connecting Thermoelectrically Operative Semiconductor Members, claiming a right of priority based upon German application S 93,220 filed abroad Sept. 18, 1964.

Our invention relates to metal connector elements or bridges for galvanically connecting thermoelectrically operative semiconductor members.

Such thermoelectrically operative semiconductor members assembled as a thermocouple battery, are shown and described for example in the now-abandoned copending application Ser. No. 150,701 of W. Hänlein filed Nov. 7 1961 and having the same assignee as that of the instant application. It is customary to construct the electrically conductive connector elements for thermoelectric elements made of semiconductor material, either as homogenous or laminated metal bridges. Stresses caused by temperature change produce expansions and contractions of the bridges which result in rapid destruction of the thermoelectric elements.

It is accordingly an object of our invention to avoid the disadvantages of the known metal connector elements or bridges of the aforementioned type and more particularly to provide a metal connector or bridge as will afford an increased durability of the thermoelectric elements of semiconductor material when stressed as a result of temperature change.

With the foregoing and other objects in view we provide, in accordance with our invention, a metal connector elemetn or bridge having a middle portion consisting of a softer material than both side portions thereof.

Thus, a softer material is added to the connecting bridge which absorbs the mechanical stresses occurring as a result of temperature changes. Soft solder is preferred as material for the soft middle piece. The metal bridges, such as of a thermoelectric battery, for example, constructed in accordance with our invention, are produced in an especially simple manner by using soft solder. For this purpose, semi-conductor members provided with metallic end plates and strips of soft solder are assembled in a device wherein the soft solder strips are located in accordance with the desired connection between the end plates. The end plates and soft solder strips are then required only to be heated in order to obtain metal bridges with a soft middle portion. The soft solder can also be deposited as a thick layer on the end plates and, during the soldering of the semiconductor member by its end plates to a heat transfer plate, the soft solder is permitted to flow into an intermediate space between the end plates which is held vacant by means of a jig or spacer of suitable known construction.

Other features which are considered as characteristic for the invention are set forth in the appended claims.

Although the invention is illustrated and described herein as embodied in metal connector elements for galvanically connecting thermoelectrically operating semiconductor members, it is nevertheless not intended to be limited to the details shown, since various modifications and structural changes may be made therein without departing from the spirit of the invention and within the scope and range of equivalents of the claims.

The invention, however, both as to its construction and method of operation, together with additional objects and advantages thereof, will be best understood from the following description of a specific embodiment when read in connection with the accompanying drawings, in which.

Figure 1:
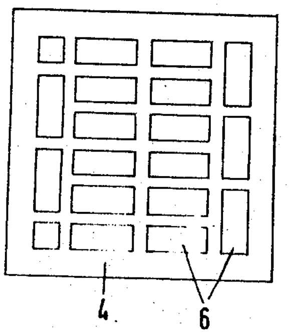
FIG. 1 is a plan view of one of the ceramic plates of a thermoelectric battery constructed in accordance with our invention, before soldering the semiconductor members thereon.
Figure 2:
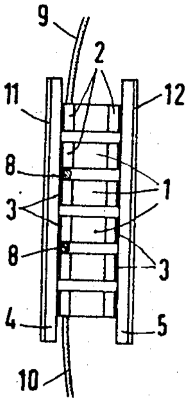
FIG. 2 is a side view of the completed thermoelectric battery of our invention.
Figure 3:
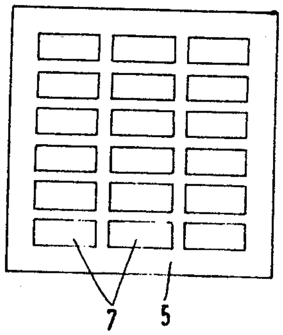
FIG. 3 is a view of the other of the ceramic plates of the thermoelectric battery before soldering the semiconductor members thereon.

Referring now to the drawing and first to FIGS. 1 to 3 thereof, there is shown a thermoelectric battery consisting of a number of thermoelectrically operating semiconductor members 1 of the p- and n-conductive types, on both sides of which metallic end plates 2 are mounted. For a further description of the thermoelectric battery, reference may be had to the aforementioned copending application Ser. No. 150,701 of W. Hänlein. The individual semiconductor members are held by solder connections 3 between two ceramic plates 4 and 5 which serve as electrically insulating heat transfer plates. The ceramic plates are metallized on the sides facing the semiconductor members, i.e. on the sides thereof viewed in FIGS. 1 and 3. FIG 1 shows the left ceramic plate 4 before soldering of the semiconductor members thereon and FIG. 3 shows the right ceramic plate 5 before soldering of the semiconductor members thereon. Metal layers 6 and 7 are visible, which correspond in their spatial location to the location of the electrically conductive connecting bridges provided between the semiconductor members. An electrical connection with suitable cross section between the semiconductor members is obtained in accordance with the invention by providing soft solder pieces 8 between the end plates 2 that are to be connected. Also shown in FIG. 2 are electrical leads 9 and 10 as well as metal layers 11 and 12 on the outer sides of the respective ceramic plates 4 and 5. The metal layers 11 and 12 afford a suitable solder connection to heat exchanges (not shown).

Thermoelectric batteries of the aforedescribed type are produced relatively simply in the following manner: First a thin layer of bismuth is deposited on the two opposing surfaces of a p-conducting or n-conducting semiconductor disc by an immersion process. Thereafter, also by means of an immersion process, the bismuth layers are coated with a solder A (lead, tin, bismuth), and copper discs are soldered thereon. There is thus obtained p- or n-conductive semiconductor plates having the layer sequence shown in FIG. 4. Thin layers of bismuth 14 sandwich a semiconductor disc 13 between them and layers 15 of solder A as well as copper plates 16 are then respectively superimposed thereon. From the thus coated or layered disc 17, there is obtained, by means of screen-shaped saws, semiconductor members of square shape provided with end plates as shown in FIG. 5. These, together with semiconductor members of the opposite conductivity type, are soldered with the aid of a screen-shaped soldering device in such a way on the metallized ceramic plate 4 that respective p- and n-conductive semiconductor members are electrically connected with one another on one side. The device is thereby so shaped that a space for the soft solder 8 is left vacant between the end plates that are to be connected, the solder 8 in the form of strips being placed in this space, for example, before heating. A similar process is employed for applying the solder to the other ceramic plate 5.

Figure 4:
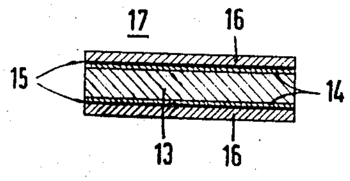
FIGS. 4 and 5 are sectional and plan views respectively of intermediate products in the process of manufacturing semiconductor members provided with metallic end plates in accordance with the invention.
Figure 5:
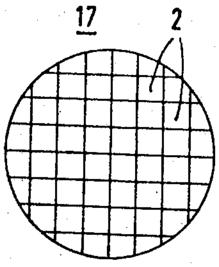

Instead of placing the soft solder in strips in the soldering device so that it forms a soft middle portion of the semiocnductor bridges, the soft solder can also be deposited on both sides of the coated and layered disc of FIG. 4 before sawing. When soldering the semiconductor member on the ceramic disc, the soft solder then yields or flows into the intermediate spaces between the end plates which are held apart by the soldering device.

Care must be taken that the soft solder have a lower melting point than the solder A so that the connection between the semiconductor members and the end plates is not loosened when soldering to the ceramic discs.

We claim:

1. A thermoelectric couple comprising a pair of semiconductor members, a pair of spaced side element portions of electrically conductive plate material in contact engagement respectively with the ends of each of the semiconductor members, and a middle element portion of electrically conductive soft solder extending in the space between and in contact engagement with said side element portions to electrically connect said portions, said plate portions together with said solder constituting the sole means electrically connecting said semiconductor members.

2. In a thermoelectric battery, a plurality of spaced, substantially square-shaped semiconductor members of alternate p- and n-conductivity, each of said semiconductor members being in contact engagement with a pair of end elements of electrically conductive plate material, and an intermediate element of electrically conductive soft solder located in the space between said semiconductor members and extending between and in contact engagement with said elements of said semiconductor members of alternate p- and n-conductivity to electrically connect said end elements, said end elements together with said solder constituting the sole means electrically connecting said semiconductor members.

3. Method of producing a metal connection galvanically connecting thermoelectrically operative semiconductor members of opposite conductivity type which comprises mounting metallic end plates on semiconductor members of opposite conductivity type spaced from one another, placing soft solder material in the space between the end plates to electrically connect said plates, and heating the end plates and the soft solder material to a temperature at which the soft solder material softens and flows into engaging contact with the end plates in the space therebetween, said plates and said solder constituting the sole means electrically connecting said semiconductor members.

References Cited

UNITED STATES PATENTS

| | | | |
|---|---|---|---|
| 3,261,713 | 7/1966 | Groten | 136—237 X |
| 3,226,804 | 1/1966 | Hasenclever | 136—201 X |

ALLEN B. CURTIS, *Primary Examiner.*

U.S. Cl. X.R.

29—573; 136—237